US010439509B1

(12) United States Patent
Sharma et al.

(10) Patent No.: US 10,439,509 B1
(45) Date of Patent: Oct. 8, 2019

(54) CIRCUIT FOR GENERATING A CONTROL VOLTAGE DEPENDING ON VOLTAGE PHASE OF AN INPUT SIGNAL

(71) Applicant: VARROC ENGINEERING LIMITED, Aurangabad, Maharashtra (IN)

(72) Inventors: Anupam Sharma, Maharashtra (IN); Nafish Jalal, Maharashtra (IN)

(73) Assignee: VARROC ENGINEERING LIMITED, Maharashtra, Aurangabad (IN)

( * ) Notice: Subject to any disclaimer, the term of this patent is extended or adjusted under 35 U.S.C. 154(b) by 0 days.

(21) Appl. No.: 16/441,269

(22) Filed: Jun. 14, 2019

Related U.S. Application Data

(63) Continuation of application No. PCT/IN2019/050437, filed on Jun. 7, 2019.

(30) Foreign Application Priority Data

Dec. 7, 2018 (IN) ............................ 201821046452

(51) Int. Cl.
*H02M 7/217* (2006.01)
*H03K 3/02* (2006.01)
*H02M 1/08* (2006.01)
*H02M 1/00* (2006.01)

(52) U.S. Cl.
CPC ............ *H02M 7/2173* (2013.01); *H03K 3/02* (2013.01); *H02M 1/083* (2013.01); *H02M 2001/0038* (2013.01)

(58) Field of Classification Search
CPC ......... H02M 2001/0038; H02M 1/083; H02M 7/217; H02M 7/2173; H03B 5/1536; H03B 17/133
See application file for complete search history.

(56) References Cited

U.S. PATENT DOCUMENTS

2007/0001654 A1* 1/2007 Newman, Jr. ........ H05B 39/044 323/235
2012/0230073 A1* 9/2012 Newman, Jr. ...... H05B 33/0815 363/126
2013/0129373 A1* 5/2013 Inukai ..................... H02M 1/32 399/88
2013/0293132 A1* 11/2013 Bockle .................. H05B 37/02 315/201
2014/0186066 A1* 7/2014 Inukai .................. H02M 7/217 399/88

* cited by examiner

*Primary Examiner* — Fred E Finch, III
(74) *Attorney, Agent, or Firm* — Tim Tingkang Xia, Esq.; Locke Lord LLP

(57) ABSTRACT

The present invention provides a circuit for generating a control voltage depending on voltage phase of an input signal. The circuit comprises a first transistor; a second transistor, a diode, a Zener diode and a capacitor. Base and collector of first transistor along with collector of second transistor are connected to a DC voltage source. Anode of the diode is connected to base of the first transistor and cathode of the diode receives the input signal. Anode of the Zener diode is connected to the base of the second transistor and cathode of the Zener diode connected to the collector of the first transistor. The capacitor is connected between cathode of the Zener diode and ground terminal. During positive half cycle and negative half of input signal, the circuit outputs a high control voltage and a low control voltage respectively.

5 Claims, 4 Drawing Sheets

200

INPUT
OUTPUT
270
240
260
280
250
210
230
220

CIRCUIT FOR GENERATING A CONTROL VOLTAGE DEPENDING ON VOLTAGE PHASE OF AN INPUT SIGNAL

CROSS-REFERENCE TO RELATED PATENT APPLICATION

This application is a continuation application of International Application No. PCT/IN2019/050437, filed on Jun. 7, 2019, which claims priority to Indian Patent Application No. 201821046452, filed on Dec. 7, 2018, the disclosures of which are hereby incorporated by reference.

FIELD OF THE INVENTION

The invention relates generally to a circuit for generating a control voltage depending on voltage phase of an input signal.

BACKGROUND OF THE INVENTION

Phase detectors are typically used to detect phase of an input signal having a positive voltage phase and a negative voltage phase. While phase detectors are found in a myriad of electronic applications, one typical application of phase detector is found in shunt regulator rectifier. A schematic diagram illustrating a conventional shunt regulator rectifier 100 configured to convert a 3-phase AC input into a DC output is shown in FIG. 1. As shown, a first rectification unit 110, 112, 114 and a second rectification unit are connected to each of the phase R, Y, B of the AC input. The first rectification unit has a FET or a diode configured to rectify positive cycle of the AC input. The second rectification unit has a MOSFET 120, 122, 124 configured to rectify negative cycle of the AC input and to shunt the AC input in case output voltage of the shunt regulator rectifier exceeds a predefined voltage. Accordingly, the shunt regulator rectifier operates in two modes. In mode one, when the output is below a predefined voltage, the AC input is rectified and passed on to the output. In mode two, when the output is above a predefined voltage, AC input is shunted.

A gate driver 130, 132, 134 is provided and configured to receive inputs from a phase detector 140, 142, 144 and a shunt controller 160, 162, 164 to control operation of the MOSFET. A voltage detector 150 is provided and configured to detect output voltage of the shunt regulator rectifier. The voltage detector provides a suitable signal to the shunt controller to commence second mode in case the output voltage is more than the predefined threshold voltage. The phase detector is configured to receive the AC input and detect whether the incoming phase is in positive half or in negative half of its cycle. Based on the phase of the AC input, a suitable signal is provided to the gate driver. Outputs from the shunt controller and phase detector are OR'ed 170, 172, 174 and provided to the gate driver. Accordingly, either the shunt controller or the phase detector may control the operation of the MOSFET.

It may be noted that during rectification of negative half of the AC input, the phase detector gives a suitable signal to the gate driver to turn the MOSFET ON to minimize voltage drop across its terminals, thereby reducing the heat generated in the MOSFET. Accordingly, appropriate detection of phase of the AC input in a shunt regulator rectifier is an important feature.

While the phase detector detects phase of AC input and provides a corresponding signal to the gate driver, it is observed that the phase detectors invariably have instability in their output around zero crossing of the phase input. When a phase detector detects that a phase is entering negative half of cycle, it commands the gate driver to turn ON MOSFET. Thus, when MOSFET is turned ON, it brings potential of the phase very close to ground voltage. Consequently, the phase detector tends to turn OFF its command because it does not see the phase voltage to be negative anymore. As soon as this command is withdrawn, the phase voltage goes negative again causing the phase detector to turn ON the MOSFET. This phenomenon continues over and over till the phase voltage enters deep into negative cycle. This instability causes the output of the phase detector to rapidly switch its output high and low during each transition of the phase from positive cycle to negative cycle and vice-versa. Consequently, such unstable input to gate driver will cause instability in the MOSFET thereby creating uncertainty in working of the shunt regulator rectifier. This can also cause failure of the MOSFET In view of the above, there is a need in the art to address at-least the aforementioned shortcomings.

SUMMARY OF THE INVENTION

Accordingly, the present invention in one aspect provides a circuit for generating a control voltage depending on voltage phase of an input signal. The circuit includes a first NPN-type transistor having a base, an emitter and a collector; a diode; a second NPN-type transistor having a base, an emitter and a collector; a Zener diode and a capacitor. The base and the collector of the first transistor are connected to a reference potential supplied by a DC voltage source. Anode of the diode is connected to base of the first transistor and cathode of the diode receives the input signal. The collector of the second transistor is connected to the reference potential supplied by the DC voltage source and provides the control voltage. Anode of the Zener diode is connected to the base of the second transistor and cathode of the Zener diode connected to the collector of the first transistor. The capacitor is connected between cathode of the Zener diode and ground terminal. During positive half cycle of the input signal, the diode is reverse biased and thus the reference voltage is applied to the base of the first transistor causing the first transistor to turn ON as a result of which the Zener diode remains in inactive mode as voltage across the capacitor remains zero causing the second transistor to be remain OFF whereby the circuit outputs a high control voltage at the collector of the second transistor. During negative half cycle of the input signal, the diode is forward biased causing the first transistor to turn OFF as a result of which the reference voltage is applied across the capacitor and the Zener diode starts conducting when voltage across the capacitor reaches to breakdown voltage of the Zener diode causing the second transistor to turn ON whereby the circuit outputs a low control voltage at the collector of the second transistor.

In an embodiment of the invention, the base and the collector of the first transistor are connected to the DC voltage source through respective resistors.

Yet, in another embodiment of the invention, the collector of the second transistor is connected to the DC voltage source through a resistor.

In another aspect, the present invention provides a regulator rectifier having a first rectification unit configured to rectify positive cycle of an AC input; a second rectification unit configured to rectify negative cycle of the AC input; the circuit as claimed in claim 1; and a driver unit connected to collector of the second transistor and configured to trigger the second rectification unit during negative cycle of the AC input whereby the second rectification unit rectifies the negative cycle of the AC input.

BRIEF DESCRIPTION OF THE DRAWINGS

Reference will be made to embodiments of the invention, examples of which may be illustrated in accompanying figures. These figures are intended to be illustrative, not limiting. Although the invention is generally described in context of these embodiments, it should be understood that it is not intended to limit the scope of the invention to these particular embodiments.

DETAILED DESCRIPTION OF THE INVENTION

The present invention is directed towards a circuit for generating a control voltage depending on phase of an input signal.

Figure 1:
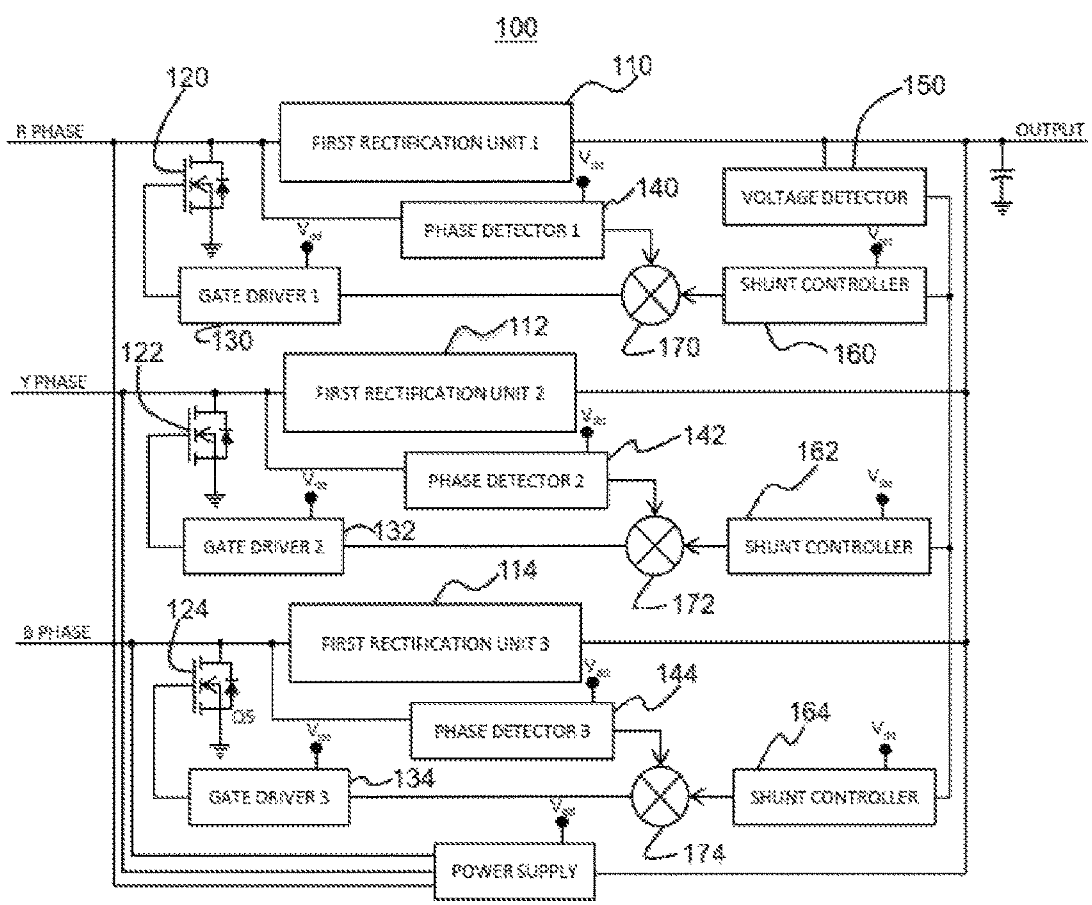
FIG. 1 is a schematic diagram illustrating a conventional shunt regulator rectifier configured to convert a 3-phase AC input into a DC output.
Figure 2:
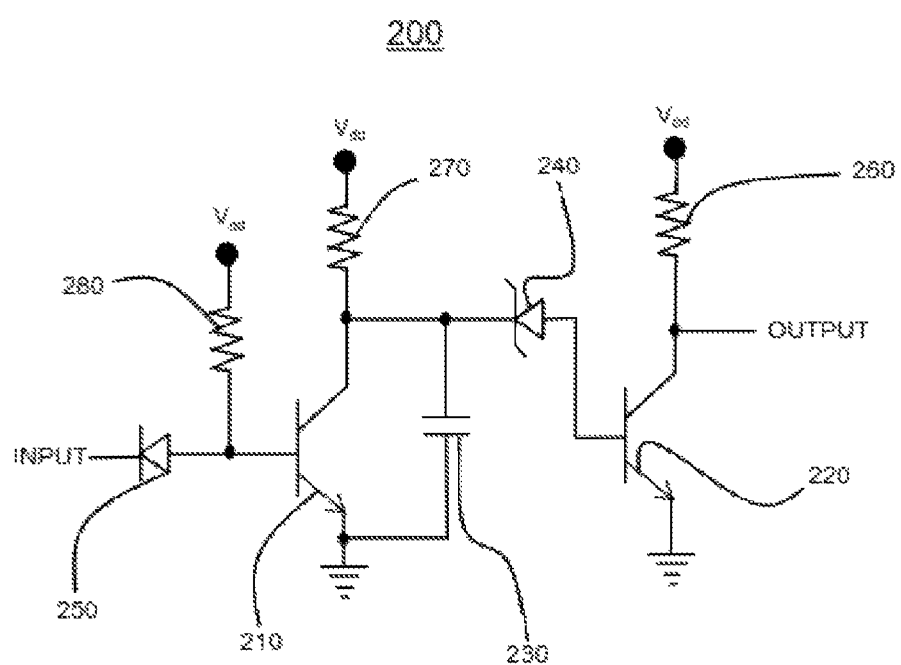
FIG. 2 is a schematic diagram illustrating a circuit for generating a control voltage depending on phase of an input signal in accordance with an embodiment of the invention.

FIG. 2 is a schematic diagram illustrating a circuit for generating a control voltage depending on phase of an input signal in accordance with an embodiment of the invention. Referring to FIG. 2, the circuit comprises a first transistor 210 having a base, an emitter and a collector, a second transistor 220 having a base, an emitter and a collector, a capacitor 230, a Zener diode 240 and a diode 250.

Collector of the first transistor 210 is connected to a reference potential supplied by a DC voltage source $V_{dd}$ thorough a current limiting resistor 270 and base is connected to the DC voltage source $V_{dd}$ through a current limiting resistor 280. Collector of the second transistor 220 is connected to the DC voltage source $V_{dd}$ through a current limiting resistor 260 and base is connected to anode of the Zener diode 240. Emitters of transistors 210, 220 are respectively grounded or connected directly to negative terminal of voltage source $V_{dd}$. Capacitor 230 is connected to the voltage source $V_{dd}$ through resistor 270. Cathode of the Zener diode 240 is connected to the capacitor 230 such that the Zener diode 240 starts conducting only when the voltage across the capacitor 230 reaches breakdown voltage of the Zener diode 240. Anode of diode 250 is connected to base of the first transistor 210 and to the voltage source $V_{dd}$ through the resistor 280. Input AC signal is provided to cathode terminal of the diode 250 and output voltage is obtained from collector terminal of the second transistor 220.

Figure 3:
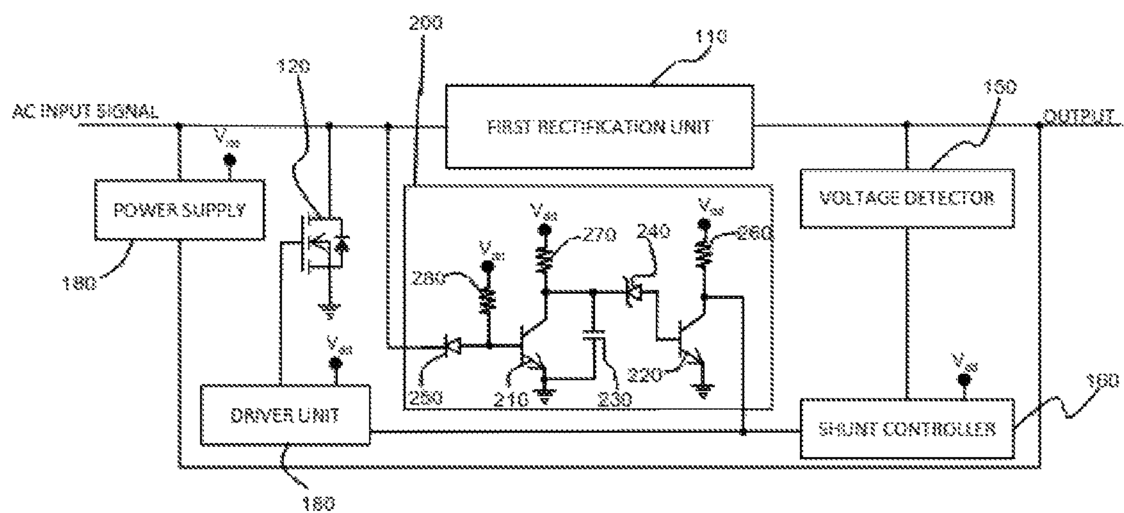
FIG. 3 is a schematic diagram illustrating a shunt regulator rectifier having a circuit for generating a control voltage depending on phase of an input signal in accordance with an embodiment of the invention.

Working of the circuitry shown in FIG. 2 will now be described hereinafter. During positive half cycle of the input AC signal, diode 250 is reverse biased and thus voltage $V_{dd}$ is applied to base of the first transistor 210 through the current limiting resistor 280 causing the first transistor to conduct thereby tuning it ON. Consequently, the first transistor 210 enters into saturation mode whereby collector of the first transistor 210 will be approximately at zero potential. As a result, voltage across the capacitor 230 will be nearly zero and thus the Zener diode 240 will remain in inactive mode due to which base of the second transistor 220 will be at zero potential. Since base of the second transistor 220 is at zero voltage, the second transistor 220 remains in an OFF condition whereby causing the collector of the second transistor 220 to be at high potential, i.e. at voltage $V_{dd}$. Referring to FIG. 3, output of the circuit 200 is obtained from collector of the second transistor 220 and provided to a driver unit 180. Since the second rectification unit 120 comprises of a MOSFET, the driver unit 180 is a gate driver 180. The gate driver 180 is configured to receive signal from the collector of the second transistor 220 and trigger the second rectification unit 120 based on the signal received from the collector of the second transistor 220. In this regard, the gate driver 180 is configured to turn OFF the MOSFET when collector is at high potential. Accordingly, when second transistor 220 is in OFF condition the collector of the second transistor 220 remains at high potential whereby the gate driver 180 turns OFF the MOSFET.

When the input signal enters negative half of the cycle, diode 250 starts conducting in forward bias mode. As a result, potential at base of the first transistor 210 falls to zero and thus first transistor 210 is turned OFF. Accordingly, voltage $V_{dd}$ is applied across the capacitor 230 whereby the capacitor 230 starts charging through the current limiting resistor 270. When voltage across the capacitor 230 reaches breakdown voltage of the Zener diode 240, Zener diode 240 starts conducting. At this stage, potential at base of the second transistor 220 rises causing the second transistor 220 to turn ON. Consequently, the second transistor 220 enters into saturation mode whereby collector of the second transistor 220 will be approximately at zero potential. Referring to FIG. 3, output of the circuit 200 is obtained from collector of the second transistor 220 and provided to the gate driver 180. As described hereinbefore, the gate driver 180 is configured to receive signal from the collector of the second transistor 220 and trigger the second rectification unit 120 based on the signal received from the collector of the second transistor 220. In this regard, the gate driver 180 is configured to turn ON the MOSFET when collector is at low potential. Accordingly, when second transistor 220 is in ON condition the collector of the second transistor 220 remains at low potential whereby the gate driver 180 turns ON the MOSFET.

It may be noted that while the invention herein has been described assuming that logic low input to the gate driver will turn ON the MOSFET and logic high input to the gate drive unit will turn OFF the MOSFET, however it will be apparent to a person skilled in the art that any other logic may be implemented to achieve the operation of the MOSFET.

Figure 4:
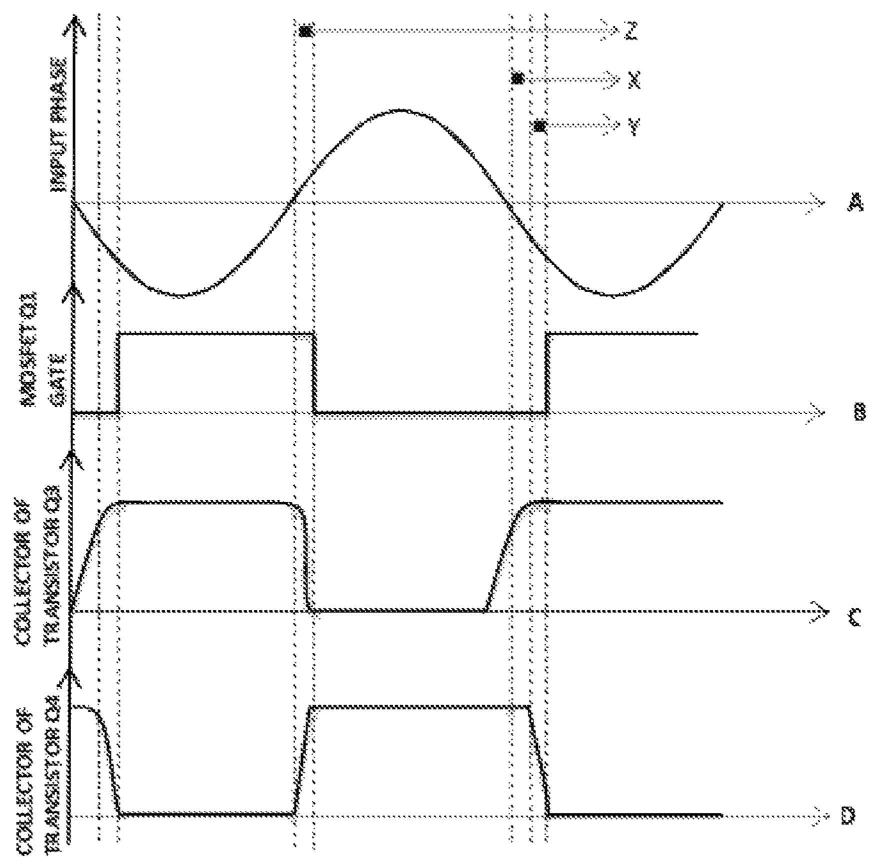
FIG. 4 shows waveforms for illustrating operation of the circuit shown in FIG. 3.

Now, reference is made to FIG. 4 which shows waveform for illustrating the operation of the circuit shown in FIG. 3. As shown, waveform A represents input signal in the form of a sine wave, waveform B represents gate voltage of MOSFET 120, waveform C represents voltage at collector of first transistor 210 and waveform D represents voltage at collector of second transistor 220. Referring to FIGS. 3 & 4 together, it can be seen that when the input signal starts going into negative cycle from positive cycle (as shown in waveform A), as described hereinbefore, voltage at collector of the first transistor 210 starts rising (shown in waveform C). Accordingly, voltage $V_{dd}$ is applied across the capacitor 230 and the capacitor 230 starts charging. When voltage across the capacitor 230 reaches to breakdown voltage of the Zener diode 240, the Zener diode 240 starts conducting thereby switching the second transistor 220 ON and bringing the collector voltage of the second transistor 220 to approximately at zero potential (as shown in waveform D). As a result, the MOSFET 120 is switched ON (as shown in waveform B). It may be noted that after the input signal enters in negative cycle and before a low logic voltage is provided by the circuit 200 to the gate driver 180, the capacitor 230 is required to be charged and the Zener diode 240 is required to conduct. Accordingly, there is a time delay caused by the capacitor 230 (shown as 'X' in FIG. 4) and the Zener diode 240 (shown as 'Y' in FIG. 4) in providing a logic low voltage to the gate driver 180. As long as the input signal remains in negative cycle, as shown in FIG. 4, voltage at collector of the first transistor 210 remains at high potential and voltage at collector of the second transistor 220 remains at low potential.

Referring again to FIGS. 3 & 4 together, it can be seen that when the input signal starts going into positive cycle from negative cycle (as shown in waveform A), as described hereinbefore, diode 250 goes into reverse bias mode and thus voltage $V_{dd}$ is applied to base of the first transistor 210 causing the first transistor 210 to turn ON. As a result voltage at collector of the first transistor 210 starts falling (as shown in waveform C). Consequently, capacitor 230 starts discharging and when voltage across the capacitor 230 goes below breakdown voltage of the Zener diode 240, the Zener diode 240 stops conducting causing the second transistor 220 to turn OFF. As a result, voltage at collector of the second transistor 220 starts (as shown in waveform D) rising causing the gate driver 180 to switch OFF the MOSFET 120 (as shown in waveform B). It may be noted that after the input signal enters in positive cycle and before a high logic voltage is provided by the circuit 200 to the gate driver 180, the capacitor 230 is required to be discharged below the breakdown voltage of the Zener diode 240. Accordingly, there is a time delay caused by the capacitor 230 (shown as 'Z' in FIG. 4) in providing a logic high voltage to the gate driver 180. As long as the input signal remains in positive cycle, as shown in FIG. 4, voltage at collector of the first transistor 210 remains at low potential and voltage at collector of the second transistor 220 remains at high potential.

Advantageously, the circuit according to present invention causes a delay in providing a change in command signal to the gate driver whenever the input signal goes into a negative cycle or a positive cycle. Further, once a command signal has been provided by the circuit of the present invention, the command signals remains the same until there is a change in cycle of the input signal. In view of these, the circuit provides a stable input to the gate driver and thereby obviating the instability in operation of MOSFET. This eventually brings certainty in functioning of the shunt regulator rectifier.

The foregoing description of the invention has been set merely to illustrate the invention and is not intended to be limiting. Since the modifications of the disclosed embodiments incorporating the spirit and substance of the invention may occur to the person skilled in the art, the invention should be construed to include everything within the scope of the disclosure.

The invention claimed is:

1. A circuit for generating a control voltage depending on voltage phase of an input signal, the circuit comprising:

a first transistor having a base, an emitter and a collector, the base and the collector of the first transistor connected to a reference potential supplied by a DC voltage source;

a diode, anode of the diode connected to the base of the first transistor and cathode of the diode receives the input signal;

a second transistor having a base, an emitter and a collector, the collector of the second transistor connected to the reference potential supplied by the DC voltage source and provides the control voltage;

a Zener diode, anode of the Zener diode connected to the base of the second transistor and cathode of the Zener diode connected to the collector of the first transistor;

a capacitor connected between cathode of the Zener diode and ground terminal; wherein during positive half cycle of the input signal, the diode is reverse biased and thus the reference voltage is applied to the base of the first transistor causing the first transistor to turn ON as a result of which the Zener diode remains in inactive mode as voltage across the capacitor remains zero causing the second transistor to be remain OFF whereby the circuit outputs a high control voltage at the collector of the second transistor, and during negative half cycle of the input signal, the diode is forward biased causing the first transistor to turn OFF as a result of which the reference voltage is applied across the capacitor and the Zener diode starts conducting when voltage across the capacitor reaches to breakdown voltage of the Zener diode causing the second transistor to turn ON whereby the circuit outputs a low control voltage at the collector of the second transistor.

2. The circuit as claimed in claim 1, wherein the base and the collector of the first transistor are connected to the DC voltage source through respective resistors.

3. The circuit as claimed in claim 1, wherein the collector of the second transistor is connected to the DC voltage source through a resistor.

4. The circuit as claimed in claim 1, wherein the first transistor and the second transistor are NPN type transistors.

5. A regulator rectifier comprising:

a first rectification unit configured to rectify positive cycle of an AC input;

a second rectification unit configured to rectify negative cycle of the AC input;

the circuit as claimed in claim 1; and a driver unit connected to collector of the second transistor and configured to trigger the second rectification unit during negative cycle of the AC input whereby the second rectification unit rectifies the negative cycle of the AC input.

* * * * *